US009162254B2

(12) United States Patent
Persoons et al.

(10) Patent No.: US 9,162,254 B2
(45) Date of Patent: Oct. 20, 2015

(54) METHOD AND APPARATUS FOR APPLYING A COATING ON A SUBSTRATE

(75) Inventors: Rosita Persoons, Balen (BE); Eric Geerinckx, Beringen (BE); Jan Gedopt, Mol (BE)

(73) Assignee: VLAAMSE INSTELLING VOOR TECHNOLOGISCH ONDERZOEK N.V. (VITO), Mol (BE)

( * ) Notice: Subject to any disclaimer, the term of this patent is extended or adjusted under 35 U.S.C. 154(b) by 1763 days.

(21) Appl. No.: 11/996,134

(22) PCT Filed: Jul. 18, 2006

(86) PCT No.: PCT/BE2006/000081

§ 371 (c)(1), (2), (4) Date: May 22, 2008

(87) PCT Pub. No.: WO2007/009197

PCT Pub. Date: Jan. 25, 2007

(65) Prior Publication Data

US 2008/0213465 A1 Sep. 4, 2008

(30) Foreign Application Priority Data

Jul. 20, 2005 (EP) .................................... 05447173

(51) Int. Cl.

| | |
|---|---|
| ***C23C 16/52*** | (2006.01) |
| ***B05D 3/00*** | (2006.01) |
| ***B05D 5/08*** | (2006.01) |
| ***B05D 3/02*** | (2006.01) |
| ***B05D 3/06*** | (2006.01) |

(52) U.S. Cl.

CPC .............. *B05D 5/083* (2013.01); *B05D 3/0218* (2013.01); *B05D 3/06* (2013.01); *B05D 2202/15* (2013.01)

(58) Field of Classification Search

USPC .................................. 427/299, 446, 447, 448

See application file for complete search history.

(56) References Cited

U.S. PATENT DOCUMENTS

| | | | | |
|---|---|---|---|---|
| 4,758,533 | A * | 7/1988 | Magee et al. | 438/662 |
| 6,217,695 | B1 * | 4/2001 | Goldberg et al. | 156/244.17 |
| 2002/0167108 | A1 * | 11/2002 | Gagnon et al. | 264/172.11 |
| 2005/0237895 | A1 * | 10/2005 | Tanaka et al. | 369/97 |

FOREIGN PATENT DOCUMENTS

| | | | |
|---|---|---|---|
| DE | 196 18 256 | A1 | 12/1997 |
| DE | 197 04 100 | A1 | 8/1998 |
| DE | 100 20 679 | A1 | 11/2001 |
| EP | 0 213 471 | A2 | 3/1971 |
| EP | 1 331 080 | A2 | 7/2003 |
| WO | WO 91/16146 | | 10/1991 |

* cited by examiner

*Primary Examiner* — Austin Murata

(74) *Attorney, Agent, or Firm* — Merchant & Gould P.C.

(57) ABSTRACT

A method for applying a coating (4) on a substrate (1), includes: —scanning a laser beam (2) along a line on the surface of said substrate. The method also includes supplying a coating forming material from a supply system (3), the system moving along the same line as the laser beam but coming up behind the laser beam, so that the coating forming material is deposited on a spot which has previously been heated by the laser beam to a temperature above the melting temperature of the coating forming material. Substantially no physical contact occurs between the laser beam and the coating forming material. Preferably, the method further includes a second step of scanning the surface a second time with the laser beam, without adding coating forming material during the second step.

10 Claims, 1 Drawing Sheet

METHOD AND APPARATUS FOR APPLYING A COATING ON A SUBSTRATE

FIELD OF THE INVENTION

The present invention is related to a method and apparatus for applying a coating on a substrate, in particular a polymer coating, for example for the production of fluoropolymer coatings on paper mill rolls.

STATE OF THE ART

There are a number of industrial production processes, which rely on the use of polymer, in particular fluoropolymer-coated process rollers to provide a non-stick, corrosion resistant surface. According to the state of the art, steel rollers and drying cylinders used in paper mills or textile industry are covered with a fluoropolymer coating because of its unique release and non-stick properties and its excellent chemical stability.

So far, the industrial requirements were met by using either a fluoropolymer sleeve bonded to the pre-treated metal surface or a spray coat based on an aqueous fluoropolymer dispersion or a fluoropolymer powder coating. The sleeve technology can only be applied on smaller rollers and delamination occurs at elevated working temperatures. The spray coating technology needs the removal of the rollers to cure the coating in high temperature furnaces during several minutes. This is a complex and costly operation.

Laser based methods have been documented as well, which do allow an in-situ application. In most of these methods, the powder is supplied to a surface, and then heated by a laser. This requires a very high energy input for heating the surface.

In document WO91/16146, a method is disclosed wherein a fluoropolymer powder is introduced into a $CO_2$-laser, which is directed towards and scanned over the surface to be coated. The powder is thereby melted and deposited onto the surface, while an active control keeps the temperature of the laser's contact zone between predefined limits. When the powder beam is completely within the laser beam, as is the case in WO91/16146, the powder absorbs a lot of energy and is consequently overheated, while the substrate temperature is still too low to obtain a good adhesion. WO91/16146 suggests widening the laser or using a double laser beam, in order to pre-heat the surface. However, even in this case, the powder is introduced into the laser beam and the problem of overheating subsists.

Document DE10020679A1 is related to a method and apparatus for applying a coating to a seam in a vehicle body. The apparatus may comprise a laser (1.3) which precedes the supply of a powder, said laser being used for the purpose of cleaning, in particular degreasing, the seam. The melting of the powder is done by applying a second laser to the powder layer, after the layer has been applied to the substrate.

AIMS OF THE INVENTION

The present invention aims to provide a method and apparatus for applying a fluoropolymer coating, using a laser beam, which does not suffer from the drawbacks of the prior art.

SUMMARY OF THE INVENTION

The invention is related to a method and apparatus as described in the appended claims. According to the invention, a substrate is provided, and a laser beam, preferably a $CO_2$-laser, is held preferably perpendicularly with respect to the surface and scanned over said surface along a line, preferably a straight line. The substrate can be any object, for example a steel roll in a rolling mill. In the case of a flat or cylindrical substrate, the laser is preferably scanned over the surface in a series of adjacent straight lines. According to the invention, a delivery system for a coating forming material, preferably comprising or consisting of a polymer powder, even more preferably a fluoropolymer powder, is provided to move along with the laser, and to supply a stream of powder, as close as possible behind the zone where the laser contacts the substrate surface. According to the invention therefore, the laser heats up the surface to a temperature above the melting temperature of the powder, and the powder is supplied to a location on the surface, after the laser has heated up said location. Contrary to existing methods, the powder is thus not introduced into the laser beam, nor is it applied before laser heating takes place. The zone where the powder beam contacts the surface needs to be as close as possible to the laser-heated zone, while still avoiding any substantial direct contact between the powder and the laser beam. The powder is thus melted by contact with the heated surface, and a coating is formed. Contrary in particular to DE10020679, the laser preceding the powder supply is not used for cleaning purposes. This laser is the actual heat source which supplies sufficient heat to the substrate, in order for the powder to melt upon contact with the substrate, whereas according to DE10020679, a second laser is provided for melting the powder, after it has been supplied to the substrate.

Preferably, the method of the invention comprises a second step, wherein the thus applied coating is re-heated through a second scan with the laser, this time without addition of powder. The laser's power during the second scan is preferably lower than during the first. The second scan preferably takes place in straight lines, perpendicular to the straight lines of the first scan. The second scan is performed to decrease the surface roughness and porosity.

The invention is equally related to an apparatus for performing the method of the invention, comprising a laser and a coating material supply system, e.g. a nozzle for supplying polymer powder. In the preferred case, this apparatus allows the substrates, e.g. paper mill rolls to be coated in-situ. A process control system is preferably present, wherein the substrate temperature at the laser-heated zone is controlled to remain within predefined limits. The process control system involves a temperature sensor, preferably a pyrometer, and control means to adapt a system parameter continuously in order for the temperature to remain within predefined limits. That parameter can be the laser output power, or the relative speed between the laser and the substrate. The apparatus can be equipped with a laser and coating forming material supply system which are arranged to be movable with respect to a stationary substrate, or with a laser and coating forming material supply system, which are stationary and wherein the apparatus further comprises a means to move the substrate with respect to the laser and supply system.

The method of the invention provides a good result given the fact that the powder is not directly contacted by the laser beam, as in prior art methods. For optimal results, the distance between the laser-heated spot and the zone where the powder beam hits the surface must be minimal. When this distance exceeds the minimal value, the surface temperature would decrease already by the time the powder hits the surface, unless the laser's power is increased. The latter would however lead to a greater risk of oxide formation, which is detrimental for a good adhesion of the coating.

DESCRIPTION OF A PREFERRED EMBODIMENT OF THE INVENTION

Figure 1A:
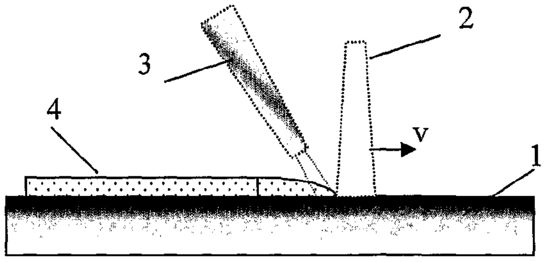
FIGS. 1*a* and 1*b* illustrate the first and second step of the method of the invention.

FIG. 1*a* illustrates the first step of the method according to the invention. One can see the substrate 1, laser beam 2, powder delivery system 3. To perform one coating pass, the laser beam as well as the powder delivery system are moving in the direction of the arrow, at a given preferably constant speed v. As a result, the polymer coating 4 is formed on the substrate surface.

Figure 1B:
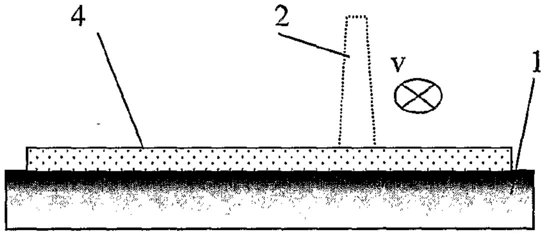

During step 2 (FIG. 1*b*), the same laserbeam is scanned over the coated surface, preferably perpendicularly or in any case at an angle to the direction of the first pass.

In the following paragraphs, a detailed description of possible and/or preferred process parameters of the method of the invention are disclosed. The experiments were carried out with a continuous 6 kW $CO_2$ laser with a beam integrator of 6×6 mm to obtain a uniform beam and temperature profile on the substrate.

During the first step the substrate (made of stainless steel or cast iron) is heated by scanning the surface with the laser beam and a fluoropolymer powder is blown on the heated surface. The carrier gas is Ar with a flow of 10 l/min and a maximum powder flow. The powder hopper (not shown) is heated to 50° C. to prevent blocking the system due to moisture. Direct interaction between the fluoropolymer powder stream and the laser beam is avoided because of the high risk of destroying the powder by the high energy level of the beam during this step. By scanning the laser and the powder delivery with a velocity of 300 mm/min and a process step width of 9 mm, a rough layer of 100 μm thick can be obtained. The surface roughness is very high due to the presence of partially melted powder especially at the borders of two passes next to each other. A closer look at the coating learns that the porosity is rather high as well. Therefore a second laser step, without powder addition, is applied to re-melt this top layer and to decrease the surface roughness and the porosity The re-melting step is performed in a direction perpendicular to the coating direction and at a much lower power level, typically 400 W and a high speed of 1000 mm/min. After this melting step the layer thickness is decreased to 22 μm.

The process is controlled by a non-contact optical pyrometer which is continuously measuring the surface temperature at the zone heated by the laser. For the closed loop control, the signal of the actual surface temperature acts as a regulating variable whereas the nominal temperature is used as command variable. According to the mechanism of the PID-controller, both signals are compared and a new output value is calculated from the difference between both values. The laser power is the preferred choice for the controller output because this is the most flexible value (compared to the laser-substrate relative speed).

Figure 2:
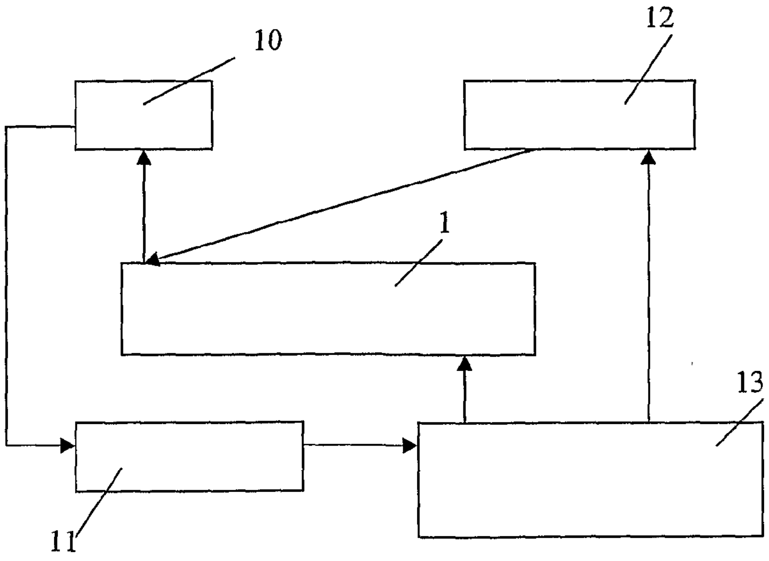
FIG. 2 shows a schematic overview of the process control system which can be applied in the method of the invention.

FIG. 2 shows a schematic view of the control loop. The output signal of the pyrometer 10, measuring the surface temperature of the substrate 1, is used as an input signal for the DAQ card 11 (after conversion from mA signal to V-signal). The measured and wanted temperatures are compared and a compensation signal is generated if needed. The computer sends the signal to the laser power generator 12 via the laser control system 13.

Examples of Materials Used and Process Parameters—Test Results

For a polyamide powder, the substrate is heated by the laser to a temperature between 120° C. and 400° C., the limits being defined respectively by the melting temperature of the powder and the temperature at which degredation of the powder occurs. The first scanning step with a polyamide powder preferably takes place at a speed of around 500 mm/min, while the second scanning step takes place preferably at around 3000 mm/min.

For a PEEK powder, the temperature to which the substrate is heated by the laser should be situated between 340 and 570° C.

The preferred embodiment of a fluoropolymer powder is a PTFE powder, in which case the substrate is heated to a temperature which is preferably situated around 400° C., while the scanning speed of the first scanning step is preferably between 300 and 600 mm/min and the scanning speed of the second step is preferably around 1000 mm/min.

The final validation was performed on industrial rollers. A drying cylinder for heavy duty furnishing textile with a length of 2 m was laser coated with a 25 μm fluoropolymer coating according to the method of the invention. This roller transports the textile through the drying area immediately after it has been printed on. The operating temperature is 130° C. which is critical for traditional coatings (sleeves). After a field trial of 6 weeks of continuous running the machine was stopped for maintenance and the rollers were controlled. The coating had absorbed some of the red dye especially on these locations were the contact between roller and tissue is the highest. This showed that the coating still shows porosities absorbing the dye but the textile showed no unwanted colouring. Besides the discoloration, the roller showed no harm and the coating was still intact which was very promising for the further use. The second validation test was performed on a paper mill drying cylinder which takes the paper pulp through a so called "hot box". The operating temperature is 130-150° C. and the paper pulp is very aggressive, containing fibres (cotton or glass fibres). After a test run of 275 hours the coating still feels quite smooth and no dramatic damages were observed. The roller was made of mild steel which easily oxidises but no oxidation was detected which shows that the porosity was reduced. Again, the high operating temperature of these rollers makes these coatings superior to sleeves which come loose due to breakdown of the adhesive at high temperature.

The invention claimed is:

1. A method for applying a coating on a substrate, comprising:

a first step of scanning a laser beam along a line on a surface of said substrate and supplying a coating forming material from a supply system, said system moving along with the laser beam and following the laser beam, so that the coating forming material is deposited on a spot which has previously been heated by the laser beam to a temperature above the melting temperature of the coating forming material to melt the coating material deposited on the spot, wherein the laser beam does not directly irradiate the coating forming material;

following completion of the first step, performing a second step of scanning the surface a second time with said laser beam, and without supplying coating forming material;

wherein the laser beam and the supply system scan the surface in the first step along a first set of adjacent or partially overlapping parallel lines, wherein passing the laser beam and depositing the coating forming material along the first set of adjacent or partially overlapping parallel lines creates a continuous coating layer; and wherein the second step takes place along second adjacent or partially overlapping parallel lines which are at an angle greater than zero to the first parallel lines, wherein passing the laser beam along the second adjacent or partially overlapping parallel lines re-melts the coating layer.

2. The method according to claim 1, wherein said second parallel lines are substantially perpendicular to the first parallel lines.

3. The method according to claim 1, wherein the first parallel lines and said second parallel lines are straight lines.

4. The method according to claim 1, wherein said coating forming material comprises a polymer powder.

5. The method according to claim 4, wherein said coating forming material is a fluoropolymer powder.

6. The method according to claim 1, wherein:

the temperature is continuously measured on the spot which is heated by the laser, said measurement is compared to a nominal value, an output value is modified, in order to minimize the difference between the measured temperature and the nominal value.

7. The method according to claim 6, wherein said output value is the power of the laser.

8. The method according to claim 6, wherein said output value is the relative speed of the laser and supply system with respect to the substrate.

9. The method of claim 1, wherein the laser beam scans the second parallel lines at a lower power than compared to power for scanning the first parallel lines.

10. The method of claim 1, wherein the laser beam scans the second parallel lines at a higher speed than compared to speed for scanning the first parallel lines.

* * * * *